United States Patent
Kong et al.

(10) Patent No.: US 10,838,032 B2
(45) Date of Patent: Nov. 17, 2020

(54) ACTIVE COOLING POWER CALIBRATING METHOD AND SYSTEM FOR ENERGY STORING UNIT

(71) Applicant: NIO CO., LTD., Shanghai (CN)

(72) Inventors: Guoling Kong, Shanghai (CN); Bin He, Shanghai (CN)

(73) Assignee: NIO CO., LTD., Shanghai (CN)

( * ) Notice: Subject to any disclaimer, the term of this patent is extended or adjusted under 35 U.S.C. 154(b) by 203 days.

(21) Appl. No.: 15/947,533

(22) Filed: Apr. 6, 2018

(65) Prior Publication Data
US 2018/0292505 A1    Oct. 11, 2018

(30) Foreign Application Priority Data
Apr. 7, 2017    (CN) .......................... 2017 1 0222879

(51) Int. Cl.
*H01M 10/48*    (2006.01)
*G01R 35/00*    (2006.01)
(Continued)

(52) U.S. Cl.
CPC .......... *G01R 35/005* (2013.01); *B60L 3/0046* (2013.01); *B60L 58/25* (2019.02); *B60L 58/26* (2019.02); *G01R 31/386* (2019.01); *G01R 31/3865* (2019.01); *G01R 31/392* (2019.01); *H01M 10/613* (2015.04); *H01M 10/625* (2015.04); *H01M 10/63* (2015.04);
(Continued)

(58) Field of Classification Search
CPC .. H01M 10/613; H01M 10/625; H01M 10/63; H01M 10/633; H01M 10/651; H01M 10/6572
See application file for complete search history.

(56) References Cited

U.S. PATENT DOCUMENTS

| | | | |
|---|---|---|---|
| 2004/0172959 A1* | 9/2004 | Oomura ............... | B60H 1/3205 62/228.1 |
| 2007/0089442 A1* | 4/2007 | Tsuchiya ............ | B60H 1/00278 62/186 |
| 2014/0116673 A1* | 5/2014 | Kang ..................... | B60H 1/004 165/222 |

* cited by examiner

*Primary Examiner* — Jane J Rhee
(74) *Attorney, Agent, or Firm* — Sheridan Ross P.C.

(57) ABSTRACT

The present application relates to heat management and control of new energy vehicle, particularly to an active cooling power calibrating method and system for energy storing unit. The application aims at resolving the problem that the existing active cooling power calibrating experiment for energy storing unit executed in a wind tunnel cabin, is inefficient and costly. The active cooling power calibrating method for energy storing unit of the present application mainly comprises the steps of: improving inlet temperature of the energy storing unit to a target temperature with a heating device; cooling the energy storing unit with a cooling system in a way of maintaining the inlet temperature at the target temperature; calibrating parameters of the cooling system when the inlet temperature is kept stable at the target temperature. When the inlet temperature of the energy storing unit is heated to the target temperature by the heating device and maintained at the target temperature by the cooling system, and the parameters of the cooling system are calibrated, the active cooling power calibrating experiment for energy storing unit executed in a wind tunnel cabin, can be substantially simulated, even completely replaced, thereby reducing development cost and enhancing development efficiency.

10 Claims, 3 Drawing Sheets

(51) Int. Cl.
*G01R 31/385* (2019.01)
*G01R 31/392* (2019.01)
*B60L 58/25* (2019.01)
*H01M 10/6572* (2014.01)
*H01M 10/63* (2014.01)
*H01M 10/625* (2014.01)
*H01M 10/613* (2014.01)
*H01M 10/633* (2014.01)
*B60L 3/00* (2019.01)
*B60L 58/26* (2019.01)
*H01M 10/651* (2014.01)

(52) U.S. Cl.
CPC ....... *H01M 10/633* (2015.04); *H01M 10/651* (2015.04); *H01M 10/6572* (2015.04); *B60L 2240/545* (2013.01); *Y02T 10/7005* (2013.01)

ACTIVE COOLING POWER CALIBRATING METHOD AND SYSTEM FOR ENERGY STORING UNIT

CROSS-REFERENCE TO RELATED APPLICATION

This application claims the benefit of China Patent Application No. 201710222879.8 filed Apr. 7, 2017, the contents of which are incorporation herein by reference in their entirety.

TECHNICAL FIELD

The present application relates to heat management and control of new energy vehicle, particularly to an active cooling power calibrating method and system for energy storing unit.

BACKGROUND

Heat management system is an indispensable part for a new energy vehicle, which can monitor the vehicle from an entire perspective and allow all key components to work at proper temperature so as to enable stable operation of the vehicle and provide excellent driving experience for drivers. Taking electric vehicle for example, when its power battery is overheating, a request for cooling power is usually sent by a vehicle controller (VCU) to an air conditioner controller (CCU) which based on the request, regulates rotation speed of a compressor in the air conditioner cooling system to match the cooling power request in order that the coolant of the air conditioner cooling system actively cools down the cooling liquid in the power battery cooling system, which in turn cools down the power battery. During the power battery cooling process, however, it is difficult for CCU to accurately match the cooling power request sent by VCU by means of adjusting the rotation speed of the compressor. Generally, the way to solve this problem is that a great deal of calibrating experiments are carried out in wind tunnel cabin to determine the speed regulating strategies of CCU for compressor in the air conditioner cooling system under different VCU cooling power requests, so that CCU is able to precisely respond to the cooling power request sent by VCU.

Taking electric vehicle for example again, VCU and CCU cooling power calibrating experiment in wind tunnel cabin is often carried out with the electric vehicle running on a roller bench to simulate the battery heating in real working condition and then calibrate compressor regulating strategies of CCU under different VCU requests by means of regulating the parameters and acquiring data. Inevitably, cooling power calibrating experiment in wind tunnel cabin brings about the problems below. Firstly, it takes longer time for the electric vehicle to reach a preset thermal equilibrium, and hence the power battery of the electric vehicle consumes too much electricity in each test and is unable to support multiple tests, directly reducing the test efficiency and thus indirectly prolonging the entire vehicle development cycle. Secondly, since a great deal of calibrating tests have to be made, which costs lots of money and is detrimental to cost control of whole vehicle development.

Accordingly, there is a need in the art for a new active cooling power calibrating method for energy storing unit to solve the previously mentioned problems.

SUMMARY

To solve the above problems in the art that the existing active cooling power calibrating experiment for energy storing unit executed in a wind tunnel cabin, is inefficient and costly. The present application provides an active cooling power calibrating method for energy storing unit, which comprises:

improving inlet temperature of the energy storing unit to a target temperature with a heating device;

cooling the energy storing unit with a cooling system in a way of maintaining the inlet temperature at the target temperature;

calibrating parameters of the cooling system when the inlet temperature is kept stable at the target temperature.

In a preferable embodiment of the active cooling power calibrating method for energy storing unit, the cooling system is an air conditioner cooling system of a tested vehicle, and the parameters include cooling power of a chiller and duty cycle of a compressor.

In a preferable embodiment of the active cooling power calibrating method for energy storing unit, the cooling power calibrating method further includes:

connecting the heating device, the energy storing unit and the chiller into a same cooling circuit.

In a preferable embodiment of the active cooling power calibrating method for energy storing unit, the step of improving inlet temperature of the energy storing unit to a target temperature with a heating device further includes:

running the heating device at a preset target power; and improving the inlet temperature of the energy storing unit to the target temperature in a way of running the heating device at the target power.

In a preferable embodiment of the active cooling power calibrating method for energy storing unit, the step of cooling the energy storing unit with a cooling system in a way of maintaining the inlet temperature at the target temperature further includes:

keeping the inlet temperature of the energy storing unit at the target temperature by regulating actual rotation speed of the compressor.

In a preferable embodiment of the active cooling power calibrating method for energy storing unit, the cooling power calibrating method further includes:

setting the cooling power of the chiller as target power of the heating device;

calculating target rotation speed of the compressor based on the target temperature and the inlet temperature of the energy storing unit; and calibrating duty cycle of the compressor obtained based on the target rotation speed and the actual rotation speed.

In a preferable embodiment of the active cooling power calibrating method for energy storing unit, the tested vehicle is a new energy vehicle, and the heating device is a high voltage heater of the new energy vehicle.

The present application also provides an active cooling power calibrating system for energy storing unit, which comprises:

a heating module for improving inlet temperature of the energy storing unit to a target temperature;

a cooling module for cooling the energy storing unit in a way of maintaining the inlet temperature at the target temperature; and a calibrating module for calibrating parameters of the cooling system when the inlet temperature is kept stable at the target temperature.

In a preferable embodiment of the active cooling power calibrating system for energy storing unit, the cooling module is an air conditioner cooling system of a tested vehicle, and the parameters include cooling power of a chiller and duty cycle of a compressor.

In a preferable embodiment of the active cooling power calibrating system for energy storing unit, the cooling power calibrating system further includes a switching module which is used for connecting the heating device, the energy storing unit and the chiller into a same cooling circuit.

In a preferable embodiment of the active cooling power calibrating system for energy storing unit, the cooling power calibrating system further includes a control module for running the heating module at a preset target temperature;

the operation of improving inlet temperature of the energy storing unit to the target temperature specifically include:

improving the inlet temperature of the energy storing unit to the target temperature in a way of running the heating device at the target power.

In a preferable embodiment of the active cooling power calibrating system for energy storing unit, the operation of cooling the energy storing unit in a way of maintaining the inlet temperature at the target temperature specifically includes:

keeping the inlet temperature of the energy storing unit at the target temperature by regulating actual rotation speed of the compressor.

In a preferable embodiment of the active cooling power calibrating system for energy storing unit, the cooling power calibrating system further includes a parameter determining module which is used for:

setting cooling power of the chiller as target power of the heating device;

calculating target rotation speed of the compressor based on the target temperature and the inlet temperature of the energy storing unit; and calibrating duty cycle of the compressor obtained based on the target rotation speed and the actual rotation speed.

In a preferable embodiment of the active cooling power calibrating system for energy storing unit, the tested vehicle is a new energy vehicle, and the heating module is a high voltage heater of the new energy vehicle.

It should be understood by those skilled in the art that in the optimized technical solutions of the present application, the active cooling power calibrating method for energy storing unit mainly comprises the steps of: improving inlet temperature of the energy storing unit to a target temperature with a heating device; cooling the energy storing unit with a cooling system in a way of maintaining the inlet temperature at the target temperature; calibrating parameters of the cooling system when the inlet temperature is kept stable at the target temperature. Among others, the heating device is the high voltage heater of the tested vehicle and the cooling system is the air conditioner cooling system of the tested vehicle. When the inlet temperature of the energy storing unit is heated to the target temperature by the high voltage heater of the tested vehicle itself and maintained at the target temperature by the air conditioner cooling system, and the parameters of the air conditioner cooling system are calibrated under the condition that the inlet temperature is kept stable at the target temperature, the active cooling power calibrating experiment for energy storing unit executed in a wind tunnel cabin, can be substantially simulated, even completely replaced, thereby reducing development cost and enhancing development efficiency.

LIST OF REFERENCE NUMBERS 11. compressor; 12. condenser; 13. PTC heater; 14. chiller; 15. expansion valve; 16. PTC fan; 21. driving motor; 22. motor cooling pump; 23 on-board charger (OBC); 24. DC/DC converter; 25. inverter; 26. heat sink; 27. fan; 31. power battery; 32. battery cooling pump; 33. three-way valve; 34. high voltage heater (HVH); and 40. four-way valve.

DETAILED DESCRIPTION

The preferred embodiments of the present application will be described below with reference to the accompanying figures. As will be understood by those skilled in the art, these embodiments are simply used for interpreting the technical principle of the present application and are not intended to limit its protection scope in any way. By way of example, although the chiller in the cooling system for air conditioner, a power battery and a high voltage heater are connected into the same cooling circuit by serially connecting the chiller into the battery cooling system, this arrangement is not invariable. Instead, it can be modified as desired to accommodate specific applications by those skilled in the art.

With an active cooling power calibrating method and system for energy storing unit, the exemplary embodiment mentioned herein obviates the setbacks in the art that existing active cooling power calibrating experiment for energy storing unit executed in a wind tunnel cabin is inefficient and costly. Specifically, the way of power battery heating is accurately simulated in the present application with the aid of heating device within cooling system of a new energy vehicle (such as, an electric vehicle), for example a high voltage heater (HVH) in an electric vehicle. As such, the active cooling power calibration of a power battery can be realized in an ordinary vehicle test filed, even when the electric vehicle is in a motionless state. Accordingly, the power calibrating experiment in a wind tunnel cabin can be replaced, reducing development expense and duration and improving research efficiency.

Figure 1:
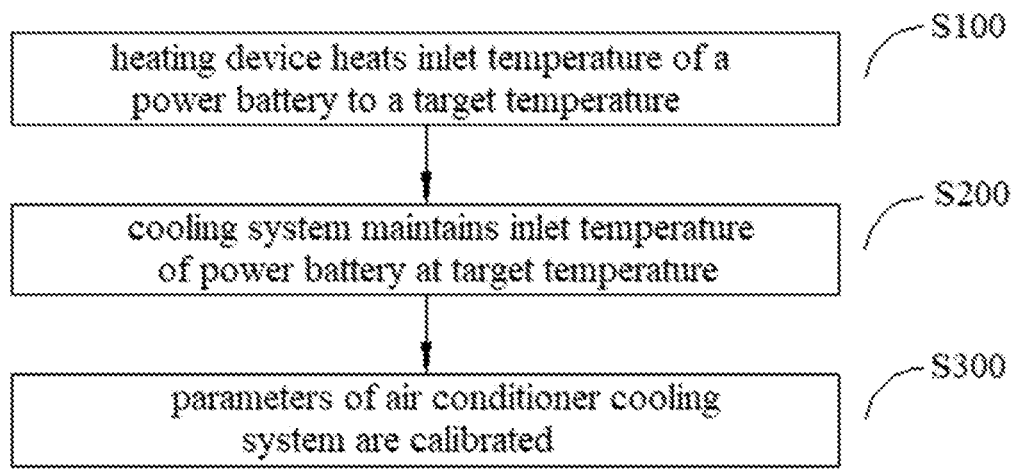
FIG. 1 is an illustrative flow chart for active cooling power calibrating method for energy storing unit of the present application.
Figure 3:
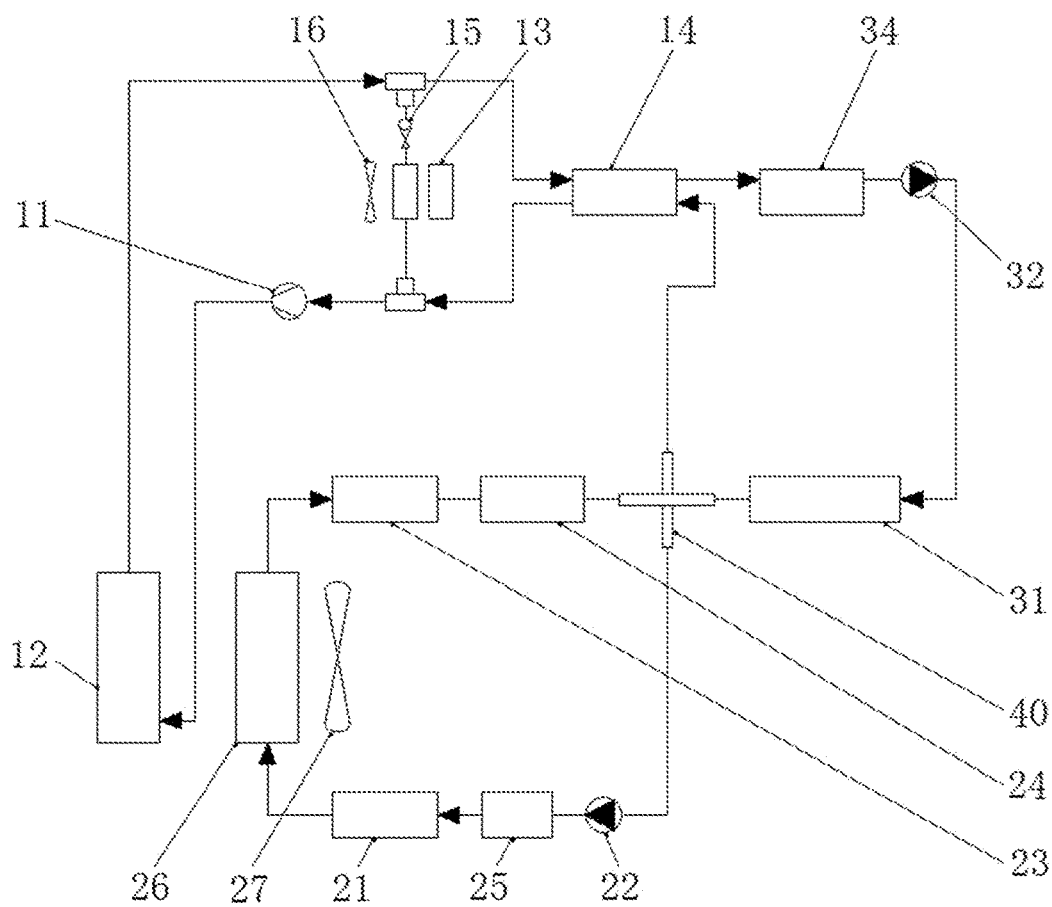
FIG. 3 is a structural illustration of heat management system used in the active cooling power calibrating method for energy storing unit of the present application.

FIG. 1 is an illustrative flow chart of active cooling power calibrating method for energy storing unit of the present application, and FIG. 3 is a structural illustration of heat management system used in the active cooling power calibrating method for energy storing unit of the present application. An exemplary active cooling power calibrating method according to the application will be described below with reference to FIG. 1 and FIG. 3. In all examples of the disclosure, the present application is depicted illustratively by means of the active cooling power calibrating method for energy storing unit and/or the heat management system thereof implemented in electric vehicle, however, its use is not limited to electric vehicles. According to one example of the active cooling power calibrating method for energy storing unit of the application, the method mainly comprises the following steps:

Step S100, during which a heating device heats the inlet temperature of a power battery 31 to a target temperature. For example, the inlet temperature of the power battery 31 is improved to the target temperature by switching on a high voltage heater 34 and running it at target power $P_{HVH}$. Among others, the target power $P_{HVH}$ can be the heating power of the power battery 31 corresponding to the current working condition point, and the target temperature can be the battery heating temperature corresponding to the current working condition point.

It should be noted that the cooling power of the power battery 31 is usually determined according to the internal heating power of the power battery 31 (for example, estimated based on the internal resistance and current of the power battery 31), the corresponding cooling power request is sent by VCU to CCU, which controls the compressor 11 in the cooling system of the air conditioner to match the cooling power value requested by VCU. In a possible embodiment, the cooling power request value could be corresponded to several working condition points based on the heating power of the power battery 31, and for each cooling power corresponding to a respective working condition point, the high voltage heater 34 can heat the battery cooling system by setting a constant power (target power $P_{HVH}$) corresponding to the cooling power of the working condition point, to precisely simulate the heating condition of the power battery 31.

Step S200, during which the power battery 31 is cooled by the cooling system in a way of keeping its inlet temperature at the target temperature. For example, the air conditioner cooling system of the electric vehicle is started and the actual rotation speed of the compressor 11 is adjusted to maintain the inlet temperature of the power battery 31 at the target temperature.

Step S300, when the inlet temperature is maintained stable at the target temperature, the parameters of the air conditioner cooling system are calibrated. For example, such parameters as the cooling power $P_{Chiller}$ of the chiller 14 in the air conditioner cooling system and the duty cycle of the compressor 11 are recorded as the inlet temperature of the power battery 31 is kept stable at the target temperature.

Figure 2:
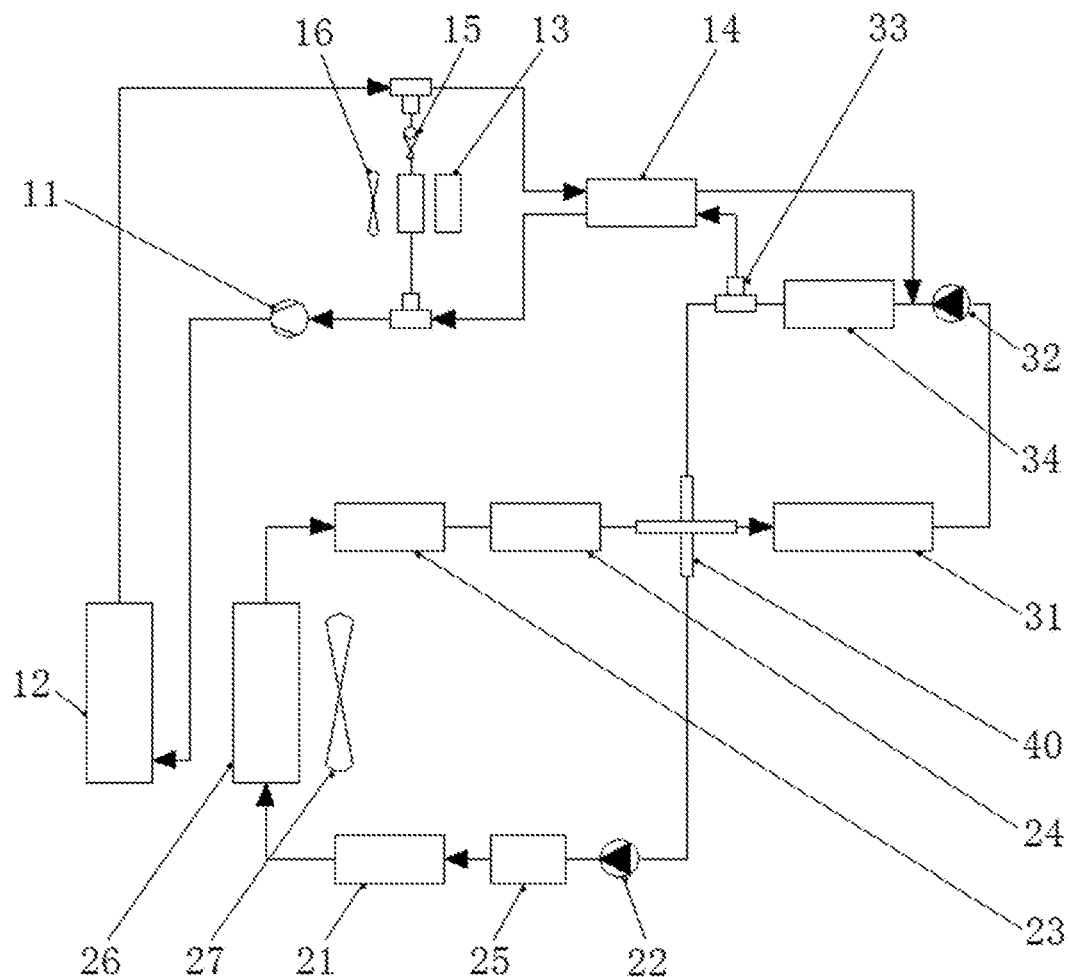
FIG. 2 is a structural illustration of heat management system of existing new energy vehicle.

FIG. 2 is a structural illustration of the heat management system for existing new energy vehicle. As shown in FIG. 2, an electric vehicle heat management system typically consist of three systems, i.e., an air conditioner cooling system, a motor cooling system and a battery cooling system. Wherein the air conditioner cooling system are mainly comprised of a compressor 11, a condenser 12, a PTC heater 13, a chiller 14, an expansion valve 15 and a PTC fan 16, and so on. The motor cooling system includes primarily such components as a driving motor 21, a motor cooling pump 22, an on-board charger (OBC) 23, a DC/DC converter 24, an inverter 25, a heat sink 26 and a fan 27 as well as pipelines connected between the above components, which are filled with cooling liquid. The battery cooling system mainly includes a power battery 31, a battery cooling pump 32, a three-way vale 33, a high voltage heater 34 and so on, as well as pipelines connected between the above components, which are also filled with cooling liquid. Wherein the motor cooling system and the battery cooling system are either in fluid communication or operate separately. The switch can be realized for example by providing between them a four-way valve 40, with the aid of which the motor cooling system and the battery cooling system can be serially connected (in fluid communication) or connected in parallel (operated separately). Also, the relationship between the battery cooling system and the air conditioner cooling system can be switched between partial fluid communication and separate operation for example by providing a three-way valve 33 between the motor cooling system and the battery cooling system. By changing the communication mode of the three-way valve 33, the battery cooling system could be switched into heating mode (in which the battery cooling system and the air conditioner cooling system are operated separately) or cooling mode (the chiller 14 is communicated with the battery cooling system).

In normal working mode, the four-way valve 40 connects the motor cooling system in parallel with the battery cooling system, that is, they are independent of each other. At this time, the motor cooling system dissipates heat through the heat sink 26 by means of circuiting the cooling liquid mainly with the aid of the motor cooling pump 22, so that such components as the driving motor 21 is kept within a suitable temperature range. The battery cooling system is responsible for maintaining the power battery 31 in a suitable working temperature range. When the power battery 31 is at too low a temperature and needs to be heated, the battery cooling system is switched into heating mode by switching the three-way valve 33. In the heating mode, the cooling liquid of the power battery 31 is heated by the high voltage heater 34 and circulated in the battery cooling system by the battery cooling pump 32, enabling the power battery 31 to work in an appropriate temperature range. When the power battery 31 is at too high a temperature and needs to be cooled, the battery cooling system is switched into cooling mode by switching the three-way valve 33. In the cooling mode, the power battery 31 is mainly cooled by heat exchange between the cooling medium in the chiller 14 and the cooling liquid within the battery cooling system, the cooling liquid is circulated in the battery cooling system by the battery cooling pump 32, enabling the power battery 31 to work in an appropriate temperature range.

As shown in FIG. 3, in order to simulate heating of the power battery 31 by the high voltage heater 34 provided on the electric vehicle and calibrate the cooling power of the power battery 31, it is necessary to modify the cooling system of the electric vehicle at first. Specifically, the chiller 14 in the air conditioner cooling system and the high voltage heater 34 in the battery cooling system are changed into serial connection instead of parallel connection with one another, and the three-way valve 33 is omitted. That is, in the modified cooling systems, the chiller 14 in the air conditioner cooling system, the high voltage heater 34 in the battery cooling system and the power battery 31 are connected into the same cooling circuit, and at this time the chiller 14 and the high voltage heater 34 could work at the same time.

After serially connecting the chiller 14 and the high voltage heater 34, the motor cooling system and the battery cooling system can be connected in parallel by switching the four-way valve 40 so as to reduce the impact of irrelevant system components on the calibrating experiment.

Under the above mentioned conditions, the high voltage heater 34 is switched on and running at target power $P_{HVH}$ in order that the inlet temperature of the power battery 31 (that is, the cooling liquid temperature at the inlet of the power battery 31) reaches the target temperature. Thereafter and during the step of S200, the air conditioner cooling system is switched on, enabling heat exchange between the chiller 14 and the cooling liquid in the battery cooling system, and the inlet temperature of the power battery 31 is finally maintained at the target temperature by regulating the actual rotation speed of the compressor 11 in the air conditioner cooling system and thus the heat exchange effect of the chiller 14 in the air conditioner cooling system.

In case of the inlet temperature of the power battery 31 being kept at the target temperature, the inlet of the power battery 31 is in a thermal equilibrium. The step of S300 can be further divided into the following steps:

Step S310, during which the cooling power of the chiller 14 is set as the target power $P_{HVH}$ of the high voltage heater 34.

In one possible embodiment, the cooling power of the chiller 14 can be calibrated by establishing the following thermal equilibrium equation at the inlet of the power battery 31, i.e., equation (1):

$$P_{HVH} - P_{Chiller} = Cq_M T'_{BattInlet} \quad (1)$$

In the equation (1), $P_{Chiller}$ indicates the cooling power of the chiller 14 with which the cooling liquid exchanges heat, C indicates the specific heat capacity of the cooling liquid, $q_M$ indicates the mass flow rate of the cooling liquid at the inlet of the power battery 31 and $T_{BattInlet}$ indicates the cooling liquid temperature at the inlet of the power battery 31.

It is known from the equation (1) that when the high voltage heater 34 works with its power being the constant target power $P_{HVH}$, by means of adjusting the actual rotation speed of the compressor 11 and thus indirectly adjusting the cooling power of the chiller 14, the heating power of the high voltage 34 can be considered as completely counteracted by the cooling power of the chiller 14 by means of for example monitoring the inlet temperature of the power battery 31 through a temperature sensor located at the inlet of the power battery 31 and ensuring that the inlet temperature of the power battery 31 is substantially constant. That is, when the inlet temperature is essentially unchanged, the value of $T'_{BattInlet}$ is approximately equal to 0, the equation (1) becomes $P_{HVH} - P_{Chiller} = 0$, therefore the target power $P_{HVH}$ of the high voltage heater 34 and the cooling power $P_{Chiller}$ of the chiller 14 can be considered as substantially the same under current circumstance. And also, since the target power $P_{HVH}$ is already known, the value of $P_{Chiller}$ can be determined.

It should be pointed out that the purpose of calibrating the cooling power with the previously described equation (1) is that when the chiller 14 cools the power battery 31 at the calibrated cooling power, further rise of the temperature of the power battery 31 can be avoided. Of course, without departing from the principle of the present application, the cooling power of the chiller 14 can also be calibrated in other ways by those skilled in the art, so as to obtain a cooling power which prevents the temperature of the power battery 31 from further rising and even brings the temperature of the power battery 31 down to a reasonable temperature range.

Step S320, during which the target rotation speed of the compressor 11 is calculated based on the target temperature and the inlet temperature and the duty cycle of the compressor 11 is calibrated based on the target rotation speed and the actual rotation speed of the compressor 11.

Figure 4:
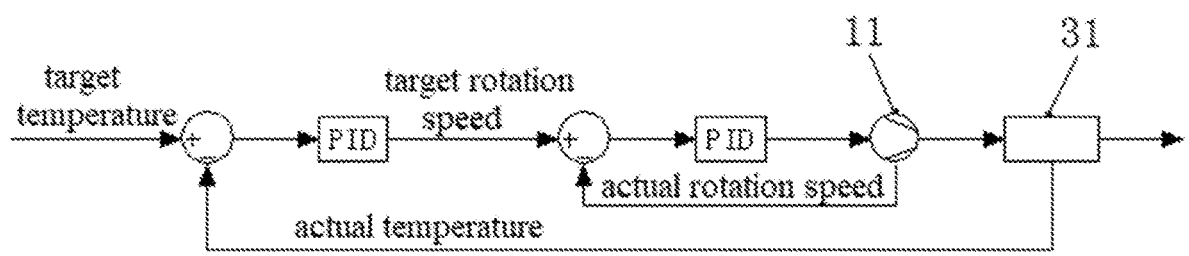
FIG. 4 is an illustrative flow chart of calibrating duty cycle of a compressor in one embodiment of the active cooling power calibrating method for energy storing unit of the present application.

FIG. 4 is an illustrative flow chart of calibrating the duty cycle of a compressor in one embodiment of active cooling power calibrating method for energy storing unit of the application. As shown in FIG. 4, in one possible embodiment, the inlet temperature of the power battery 31 can be used in a double closed loop control strategy to calibrate the duty cycle of the compressor 11. Specifically:

First of all, the target rotation speed of the compressor 11 is calculated based on the inlet temperature and target temperature of the power battery 31. For example, a PID process can be carried out for the temperature difference between the inlet temperature and the target temperature of the power battery 31 to calculate the target rotation speed of the compressor 11. Of course, the target rotation speed of the compressor 11 could be calibrated in many other ways, which can be adjusted based on specific applications by those skilled in the art.

Then, based on the target rotation speed and the actual rotation speed of the compressor 11, the duty cycle of the compressor 11 is calculated. For example, the PID process can also be carried out for the speed difference between the target rotation speed and the actual rotation speed of the compressor 11 to calculate the duty cycle of the compressor 11.

Likewise, the duty cycle of the compressor 11 could be calibrated in many other ways, which can be adjusted based on specific applications by those skilled in the art.

So far the calibrating experiment of the present working condition point has been completed.

Based on the calibrated duty cycle of the compressor 11, the actual rotation speed of the compressor 11 corresponding to the cooling power under the current working condition point can be obtained.

As stated above, in the active cooling power calibrating method for energy storing unit of the application, the cooling power calibrating experiment of the power battery 31 executed in a wind tunnel cabin can be substantially stimulated, even completely replaced by precisely simulating the heating of battery 31 with the high voltage heater 34 of electric vehicle, by calibrating the cooling power of the compressor 11 through establishment of thermal equilibrium at the inlet of the power battery 31 and by calibrating the duty cycle of the compressor 11 using a double closed loop strategy. The previously mentioned method effectively reduces development cost and duration and enhances development efficiency during the whole vehicle development.

Of course, the above stated serial connection mode, parallel connection mode, heating mode and cooling mode are simply possible ways of the inner construction of the electric vehicle in optimized embodiments of this application, and without departing from the principles of the application, the method can be applied to other new energy vehicles by those skilled in the art. Specifically, in the present application, the chiller 14, the power battery 31 and the high voltage heater 34 are coupled into the same cooling circuit by serially connecting the chiller 14 of the air conditioner cooling system into the battery cooling system. Yet it should be understood by those skilled in the art that any other different ways of connecting the chiller 14 of the air conditioner cooling system into the same cooling circuit with the high voltage heater 34 and the power battery 31 of the battery cooling system, can be employed to realize the present application.

Figure 5:
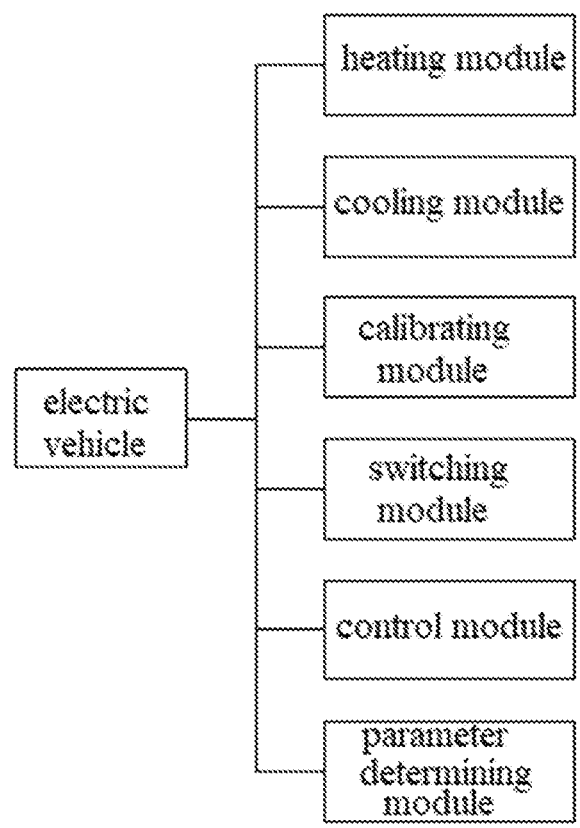
FIG. 5 is a structural illustration of the active cooling power calibrating system for energy storing unit of the present application.

FIG. 5 is a structural illustration of the active cooling power calibrating system for energy storing unit of the application. As shown in FIG. 5, another aspect of the application provides an active cooling power calibrating system for energy storing unit. Taking electric vehicle for example again, the cooling power calibrating system mainly comprises:

A heating module, which is used for heating the inlet of the power battery 31 to the target temperature. By way of example, the heating module may be the high voltage heater 34 in an electric vehicle. The inlet of the power battery 31 reaches the target temperature by running the high voltage heater 34 at the target power for instance. Wherein the target power $P_{HVH}$ can be the heating power of the power battery 31 corresponding to the present working condition point, and the target temperature can be the heating temperature of the battery corresponding to the current working condition point.

A cooling module, which is used for cooling the power battery 31 in a way of "keeping the inlet at the target temperature". By way of example, the cooling module may be the air conditioner cooling system of electric vehicle. The inlet could be kept at the target temperature by regulating the actual rotation speed of the compressor 11 and therefore maintaining the inlet of the power battery 31 at the target temperature by the chiller 14 cooling the power battery 31.

A calibrating module, which is used to calibrate parameters of the cooling module when the inlet is kept at the target temperature. By way of example, the parameters may be the cooling power of the chiller 14 of the air conditioner system and the duty cycle of the compressor 11 of the air conditioner system, etc.

Moreover, the cooling power calibrating system further includes a switching module, a control module and a parameter determining module. Wherein the switching module is used for connecting the high voltage heater 34, the power battery 31 and the chiller 14 of the air conditioner cooling system into the same cooling circuit. The control module is used to run the high voltage heater 34 at a preset target power. The parameter determining module sets the cooling power of the chiller 14 as the target power of the heating module, calculates the target rotation speed of the compressor 11 based on the target temperature and the inlet temperature of the power battery 31, and calibrates the duty cycle of the compressor 11 based on the target rotation speed and the actual rotation speed.

In the above described preferable embodiments, the active cooling power calibrating method for energy storing unit mainly comprises: heating the inlet of the power battery 31 to the target temperature by the heating device; cooling the power battery 31 by the cooling system in a way of maintaining the inlet at the target temperature; and calibrating the parameters of the cooling system when the inlet is kept at the target temperature. The active cooling power calibrating system for energy storing unit mainly comprises a heating module, a cooling module, a calibrating module, a switching module, a control module and a parameter determining module. By modifying the structure of the heat management system in an electric vehicle (for example, serially connecting the chiller 14 of the air conditioner cooling system, the high voltage heater 34 of the battery cooling system and the power battery 31), the heating of the battery pack is precisely simulated by means of the high voltage heater 34, the cooling power of the compressor 11 is calibrated by means of establishing a thermal equilibrium equation at the inlet of the power battery 31, and the duty cycle of the compressor 11 is calibrated with the aid of the double closed loop strategy. As a result, the cooling power calibrating experiment of the power battery 31 executed in a wind tunnel cabin can be substantially stimulated, even replaced by the active cooling power calibrating method of the present application, such that during the whole vehicle development, development cost and duration can be effectively reduced and development efficiency can be enhanced.

So far the technical solutions of the present application have been described with reference to the preferred embodiments shown in the accompanying figures. However, as will be appreciated by those skilled in the art that these specific embodiments are not intended to limit protection scope of the application. It will be understood by those skilled in the art that without departing from the principle of the application, various changes may be made and equivalents may be substituted for related technical features, the varied or substituted technical solutions will fall within protection scope of the present application.

What is claimed is:

1. An active cooling power calibrating method for energy storing unit, comprising:
    improving inlet temperature of the energy storing unit to a target temperature with a heating device;
    cooling the energy storing unit with a cooling system in a way of maintaining the inlet temperature at the target temperature;
    calibrating parameters of the cooling system when the inlet temperature is kept stable at the target temperature,
    wherein the cooling system is an air conditioner cooling system of a tested vehicle, and the parameters include cooling power of a chiller and a duty cycle of a compressor;
    wherein improving inlet temperature of the energy storing unit to the target temperature with the heating device further includes:
    running the heating device at a preset target power; and
    improving the inlet temperature of the energy storing unit to the target temperature in a way of running the heating device at the target power;
    wherein cooling the energy storing unit with the cooling system in a way of maintaining the inlet temperature at the target temperature further includes:
    keeping the inlet temperature of the energy storing unit at the target temperature by regulating actual rotation speed of the compressor.

2. The active cooling power calibrating method for energy storing unit as set forth in claim 1, wherein the cooling power calibrating method further includes:
    connecting the heating device, the energy storing unit and the chiller into a same cooling circuit.

3. The active cooling power calibrating method for energy storing unit as set forth in claim 1, wherein the cooling power calibrating method further includes:
    setting the cooling power of the chiller as target power of the heating device;
    calculating target rotation speed of the compressor based on the target temperature and the inlet temperature of the energy storing unit; and
    calibrating duty cycle of the compressor obtained based on the target rotation speed and the actual rotation speed.

4. The active cooling power calibrating method for energy storing unit as set forth in claim 1, wherein the tested vehicle is a new energy vehicle, and the heating device is a high voltage heater of the new energy vehicle.

5. An active cooling power calibrating system for energy storing unit, comprising:
    a heating module for improving inlet temperature of the energy storing unit to a target temperature;
    a cooling module for cooling the energy storing unit in a way of maintaining the inlet temperature at the target temperature; and
    a calibrating module for calibrating parameters of the cooling system when the inlet temperature is kept stable at the target temperature;

wherein the cooling module is an air conditioner cooling system of a tested vehicle, and the parameters include cooling power of a chiller and a duty cycle of a compressor;

wherein the cooling power calibrating system further includes a control module for running the heating module at a preset target temperature;

the operation of improving inlet temperature of the energy storing unit to the target temperature specifically includes:

improving the inlet temperature of the energy storing unit to the target temperature in a way of running the heating device at the target power;

wherein the operation of cooling the energy storing unit in a way of maintaining the inlet temperature at the target temperature specifically includes:

keeping the inlet temperature of the energy storing unit at the target temperature by regulating actual rotation speed of the compressor.

6. The active cooling power calibrating system for energy storing unit as set forth in claim 5, wherein the cooling power calibrating system further includes a switching module which is used for connecting the heating device, the energy storing unit and the chiller into a same cooling circuit.

7. The active cooling power calibrating system for energy storing unit as set forth in claim 5, wherein the cooling power calibrating system further includes a parameter determining module which is used for:
setting cooling power of the chiller as target power of the heating device;
calculating target rotation speed of the compressor based on the target temperature and the inlet temperature of the energy storing unit; and
calibrating duty cycle of the compressor obtained based on the target rotation speed and the actual rotation speed.

8. The active cooling power calibrating system for energy storing unit as set forth in claim 5, wherein the tested vehicle is a new energy vehicle, and the heating module is a high voltage heater of the new energy vehicle.

9. The active cooling power calibrating method for energy storing unit as set forth in claim 2, wherein the tested vehicle is a new energy vehicle, and the heating device is a high voltage heater of the new energy vehicle.

10. The active cooling power calibrating system for energy storing unit as set forth in claim 6, wherein the tested vehicle is a new energy vehicle, and the heating module is a high voltage heater of the new energy vehicle.

* * * * *